(12) United States Patent
Choi et al.

(10) Patent No.: US 6,844,232 B2
(45) Date of Patent: Jan. 18, 2005

(54) FLASH MEMORY DEVICE AND FABRICATING METHOD THEREFOR

(75) Inventors: Tae Ho Choi, Kyunggi-do (KR); Jae Yeong Kim, Kyunggi-do (KR)

(73) Assignee: Anam Semiconductor, Inc., Seoul (KR)

( * ) Notice: Subject to any disclaimer, the term of this patent is extended or adjusted under 35 U.S.C. 154(b) by 0 days.

(21) Appl. No.: 10/679,483

(22) Filed: Oct. 7, 2003

(65) Prior Publication Data

US 2004/0071025 A1 Apr. 15, 2004

Related U.S. Application Data

(62) Division of application No. 10/316,908, filed on Dec. 12, 2002.

(30) Foreign Application Priority Data

Sep. 19, 2002 (KR) ......................................... 2002-57111

(51) Int. Cl.[7] ............................................. H01L 21/336
(52) U.S. Cl. ....................................... 438/259; 438/270
(58) Field of Search .......................... 438/259, 42, 262, 438/263, 266, 267, 270, 424, 427, 254, 257, 700, 706, 735, 745

(56) References Cited

U.S. PATENT DOCUMENTS

| | | | | |
|---|---|---|---|---|
| 6,051,465 A | * | 4/2000 | Kato et al. | 438/258 |
| 6,124,168 A | * | 9/2000 | Ong | 438/263 |
| 6,236,082 B1 | * | 5/2001 | Kalnitsky et al. | 257/315 |
| 6,340,611 B1 | * | 1/2002 | Shimizu et al. | 438/201 |
| 6,459,121 B1 | * | 10/2002 | Sakamoto et al. | 257/315 |

* cited by examiner

*Primary Examiner*—David Nhu
(74) *Attorney, Agent, or Firm*—Bacon & Thomas

(57) ABSTRACT

A cell transistor of a flash memory device includes a semiconductor substrate, a source region, a drain region, a floating gate, an inter-gate insulating layer, and a control gate, wherein the floating gate has a tip protruding into an end portion of the source region. With the application of erasing voltages to the source region and the control gate, an intense electric field is induced on the tip of the floating gate. Accordingly, an erasing efficiency of the cell transistor can be enhanced.

10 Claims, 6 Drawing Sheets

FLASH MEMORY DEVICE AND FABRICATING METHOD THEREFOR

This application is a divisional application of pending U.S. application Ser. No. 10/316,908, filed Dec. 12, 2002 (of which the entire disclosure of the pending, prior application is hereby incorporated by reference).

FIELD OF THE INVENTION

The present invention relates to a semiconductor device and a fabricating method therefor; and, more particularly, to a flash memory device having an improved erase efficiency and a fabricating method therefor.

BACKGROUND OF THE INVENTION

A non-volatile memory device does not lose information stored in its memory cells, even when its power is interrupted. This characteristic makes the non-volatile memory device be widely adopted in, e.g., computers, digital cameras, and mobile phones. A flash memory device is one of typical non-volatile memory devices.

The flash memory device is a variation of an electrically erasable programmable read only memory (EEPROM) device, whose memory is erased by a sector-by sector bias. The state or data of a memory cell depends on the number of electrons stored in a gate structure of the cell. The cell's data is altered by applying a strong electric field between the gate structure and a source (or drain) to transfer electrons therebetween. The process of removing electrons from the gate structure is called an erase operation, and the process of accumulating electrons therein is called a program operation.

The flash memory device is classified into a stack gate or a split gate structure. The stack gate type flash memory is a most commonly used cell in flash memories and includes a control gate for receiving a driving voltage and a floating gate for storing electrons, wherein the control gate is simply stacked on the floating gate. The split gate type flash memory includes a select gate and a floating gate, wherein a portion of the select gate overlaps with the floating gate and the other portion thereof is arranged on a surface of a substrate.

FIG. 1 shows a cell array of a typical stack gate type flash memory device. The architecture includes a multiplicity of horizontal word lines "WL1-WLm" and a plurality of vertical bit lines "BL1-BLi", "m" and "i" being integers, wherein a memory cell region is defined at each of the intersection regions of the word and the bit lines. Installed at each of the memory cell regions is a cell transistor "T" having a source "S", a drain "D", and a gate "G". The source "S" of each transistor "T" is electrically connected to a common source line "SL"; the drain "D", to a corresponding bit line; and the gate "G", to a corresponding word line.

FIG. 2 presents a cross-sectional view of the cell transistor "T" shown in FIG. 1 according to a prior art. A source region 7a and a drain region 7b respectively serving as the source "S" and the drain "D" are disposed in a semiconductor substrate 2, on which a gate or tunnel oxide 3, a floating gate 4, an inter-gate insulating layer 5, and a control gate 6 are sequentially disposed. The drain region 7b is spaced apart from the source region 7a by a channel interposed therebetween. The floating gate 4 may overlap with opposing end portions of the source region 7a and the drain region 7b.

In a typical program operation of the cell transistor "T" (FIG. 1), a first programming voltage (e.g., 10V) is applied to the control gate 6 via a corresponding word line and a second programming voltage (e.g., 6V) is applied to the drain region 7b via a corresponding bit line, while the source region 7a and the semiconductor substrate 2 are grounded. The first and the second programming voltage induce electrons at the channel region close to the drain region 7b to be injected through the gate oxide 3 into the floating gate 4 and stored therein, thus completing the program operation. In an erase operation, a first erasing voltage (e.g., 6V) is applied to the source region 7a via the source line "SL" (FIG. 1) and a second erasing voltage (e.g., -9V) is applied to a corresponding gate line, whereby the electrons stored in the floating gate 4 are removed to the source region 7a through the tunnel oxide 3.

Raising the erasing voltage or reducing the thickness of the tunnel oxide may provide a higher erase efficiency of the above-explained stack gate cell transistor. However, such an increased erasing voltage or a reduced thickness of the tunnel oxide deteriorates the durability of the flash memory device.

SUMMARY OF THE INVENTION

It is, therefore, a primary object of the present invention to provide a flash memory having an enhanced erase efficiency without deteriorating the reliability, and a fabricating method therefor.

In accordance with one aspect of the present invention, there is provided a cell transistor for a flash memory device, the cell transistor including: a semiconductor substrate having a groove; a source region disposed in the semiconductor substrate, wherein the groove is recessed into an end portion of the source region; a drain region disposed in the semiconductor substrate to oppose the end portion of the source region; a gate insulating layer disposed on the substrate; and a floating gate, an inter-gate insulating layer, and a control gate sequentially disposed on the gate insulating layer, the floating gate overlapping with each opposing end portion of the source region and the drain region, wherein a portion of the floating gate protrudes to fill the groove in the source region.

In accordance with another aspect of the present invention, there is provided a method of fabricating a cell transistor, the method including the steps of: forming a groove recessed into a semiconductor substrate; forming a source region in the semiconductor substrate, wherein the source region overlaps with the groove; sequentially forming a gate insulating layer, a floating gate, an inter-gate layer, and a control gate on the semiconductor substrate, wherein the floating gate fills the groove of the semiconductor substrate; and forming a drain region in the semiconductor substrate to thereby fabricate the cell transistor.

BRIEF DESCRIPTION OF THE DRAWINGS

The above and other objects and features of the present invention will become apparent from the following description of the preferred embodiment given in conjunction with the accompanying drawings, in which.

DETAILED DESCRIPTION OF THE PREFERRED EMBODIMENT

Figure 1:
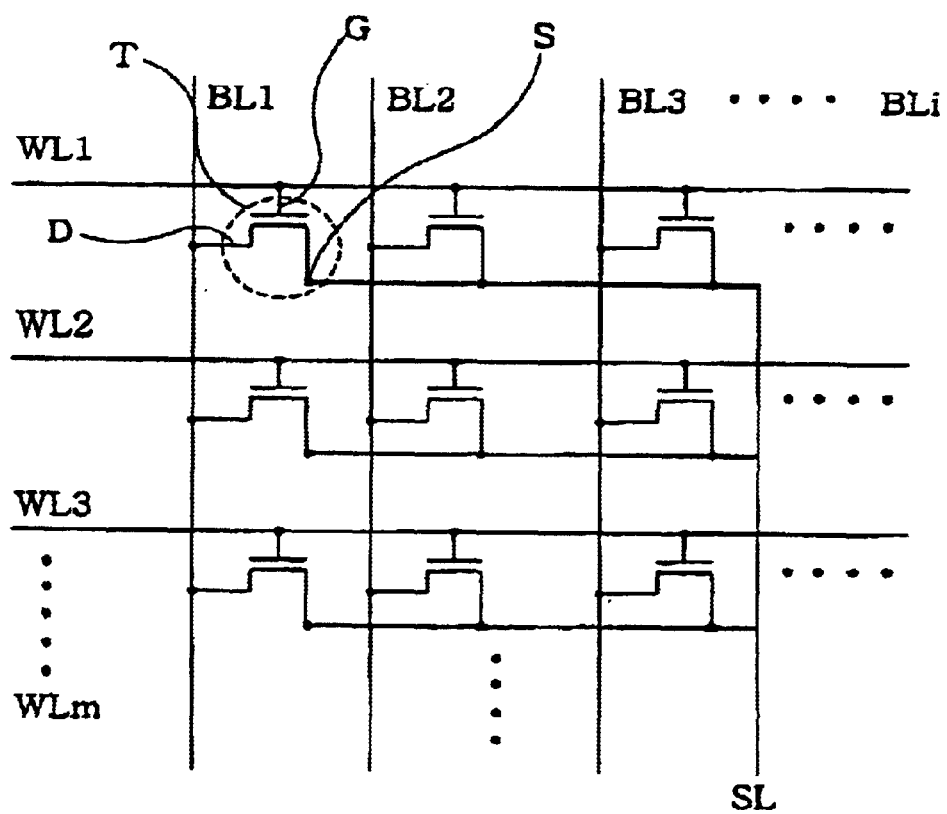
FIG. 1 presents a schematic array of a stack gate type flash memory device.
Figure 2:
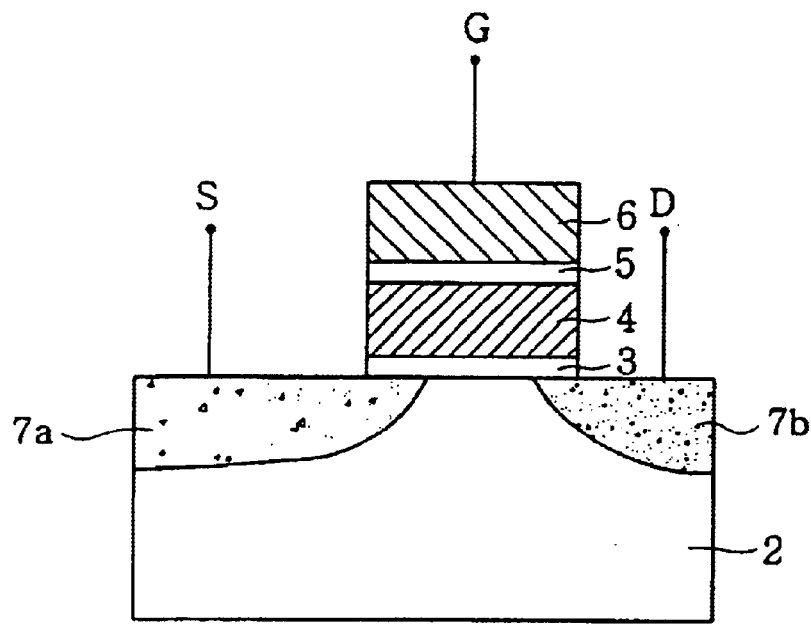
FIG. 2 provides a cross-sectional view of a conventional stack gate type cell transistor.
Figure 3:
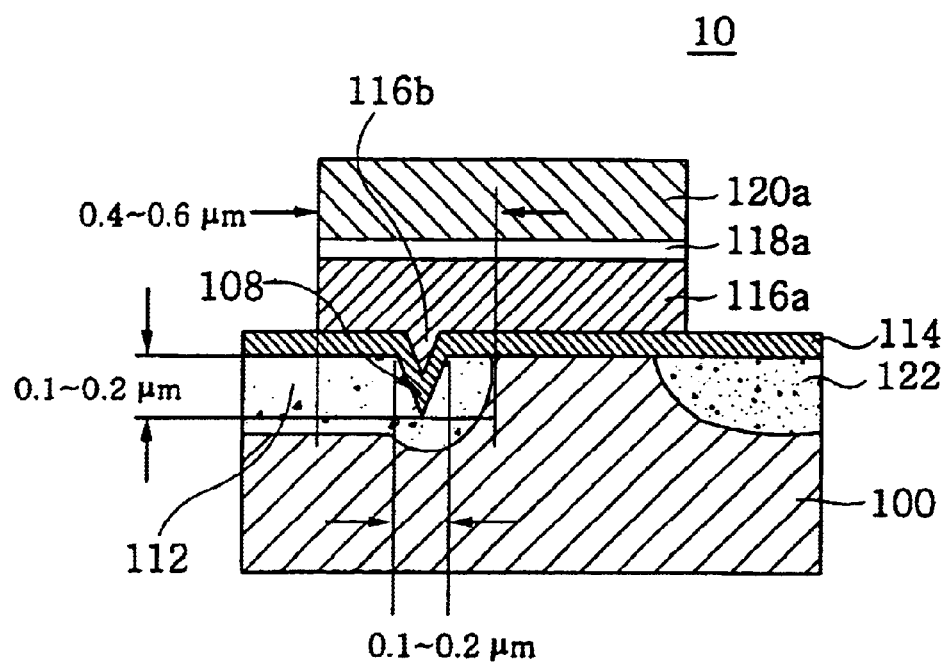
FIG. 3 represents a cross-sectional view of a cell transistor of a stack gate type flash memory in accordance with a preferred embodiment of the present invention.

Referring now to FIGS. 3 to 4, a stack gate type flash memory device and a fabricating method therefor in accordance with a preferred embodiment of the present invention will be described in detail. Like numerals represent like parts in the drawings.

In FIG. 3, a cell transistor 10 of the stack gate type flash memory device in accordance with the preferred embodiment of the present invention includes a semiconductor substrate 100 having a groove 108. Disposed therein are a source region 112 and a drain region 122 defining a channel region therebetween; sequentially disposed thereon are a gate insulating layer 114, a floating gate 116a having a tip 116b, an inter-gate insulating layer 118a, and a control gate 120a. The gate insulating layer 114 can be provided in the region right below the floating gate 116a, wherein the source region 112 and the drain region 122 can be covered with a different insulating layer.

The source region 112 and the drain region 122 are positioned to oppose each other at end portions thereof with a channel region interposed therebetween. The groove 108 is provided at the end portion of the source region 112 so that the source region 112 has thereat a greater depth. The floating gate 116a overlaps with the end portions of the source region 112 and the drain region 122.

The groove 108 is preferably a V-shaped, a U-shaped, or a rectangular groove and the tip 116b of the floating gate 116a is of a conformal shape as the groove 108. If the channel length of the cell transistor 10 is set to be about 0.6 µm or greater, the groove 108 is preferably formed to have a depth of about 0.1 µm to about 0.2 µm when measured from a top surface of the source region 112, and a width of about 0.1 µm to about 0.2 µm when measured thereon. The floating gate 116a is preferably positioned to make the source region 112 overlap with an overlap width of about 0.4 µm to about 0.6 µm.

With the application of erasing voltages to the source region 112 and the control gate 120a, an intense electric field is induced on the tip 116b of the floating gate 116a. Accordingly, an erasing efficiency of the cell transistor 10 can be enhanced.

Referring to FIGS. 4A to 4J, a sequential process for fabricating the cell transistor shown in FIG. 3 will be explained.

Figure 4A:
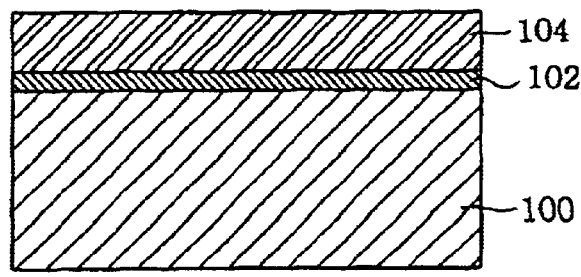
FIGS. 4A to 4J are sequential cross-sectional views illustrating a method for fabricating the cell transistor shown in FIG. 3.
Figure 4B:
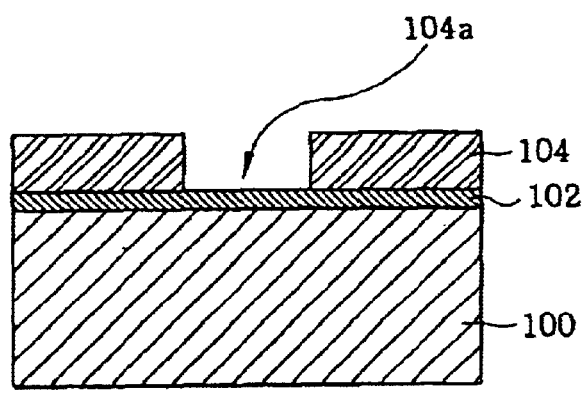

In FIG. 4A, a buffer layer 102 and an etching mask layer 104 are sequentially formed on the semiconductor substrate 100. It is preferable that the buffer layer 102 and the etching mask layer 104 have different etching selectivities. For example, if the buffer layer 102 is made of silicon oxide, the etching mask layer 104 can be made of silicon nitride. In FIG. 4B, the etching mask layer 104 is photolithographically patterned such that an opening portion 104a is formed therethrough. A corresponding portion of the buffer layer 102 is exposed through the opening portion 104a.

Figure 4C:
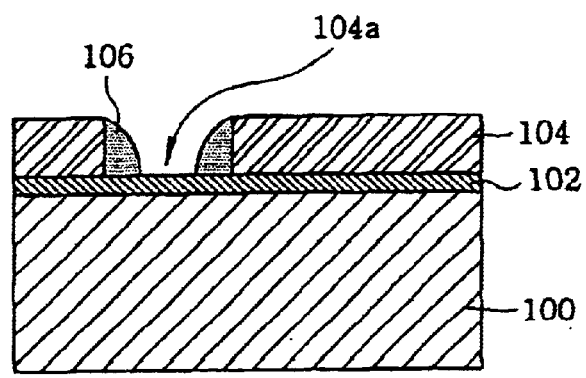

In FIG. 4C, a spacer 106 is formed on a side wall of the opening portion 104a by blanket-depositing and etching an insulating material on the etching mask layer 104 and the buffer layer 102 exposed through the opening portion 104a. The insulating material for the spacers 106 and the etching mask layer 104 may have the same or different etching selectivities. For example, a silicon nitride can be selected for each of them. A width of the exposed portion of the buffer layer 102 is reduced because the spacer 106 covers peripheries thereof in this step, wherein the spacer serves to further reduce the exposed area of the buffer layer 102. Since the width of the exposed portion of the buffer layer 102 defines the width of the groove 108 shown in FIG. 3, the reduction thereof in this step may help to reduce the cell size.

Figure 4D:
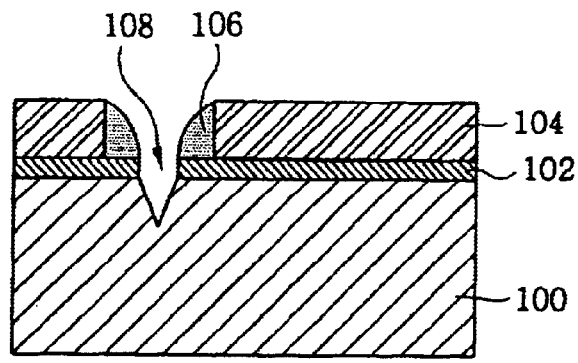
Figure 4E:
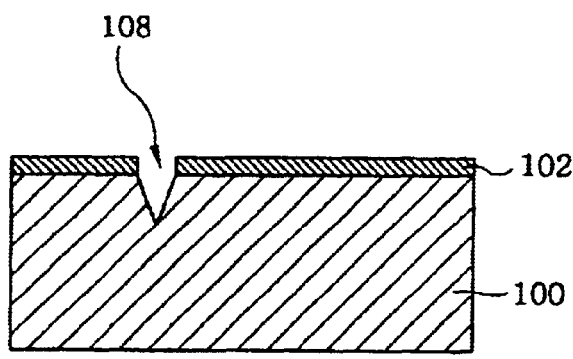

In FIG. 4D, the exposed portion of the buffer layer 102 is removed and a dry etching or a wet etching is applied to the semiconductor substrate 100 such that a groove 108 is formed. The groove 108 may be a V-shaped, a U-shaped or a rectangular groove. When the cell transistor in accordance with the preferred embodiment has a channel length of about 0.6 µm or greater, the groove 108 is preferably set to have a depth of about 0.1 µm to about 0.2 µm and a width of about 0.1 µm to about 0.2 µm. In FIG. 4E, the etching mask layer 104 and the spacers 106 are removed.

Figure 4F:
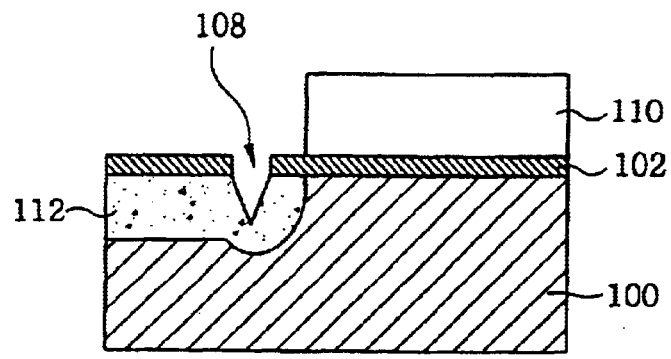

In FIG. 4F, after a first photoresist pattern 110 is formed to cover a portion of the buffer layer 102, a source dopant is implanted in the semiconductor substrate 100 through a non-covered portion of the buffer layer 102 so that the source region 112 is formed to overlap with the groove 108 at an end portion thereof. A high concentration N-type implantation may be used to form the source region 112, so that the cell transistor in accordance with the preferred embodiment becomes an N-channel type. An N-type dopant, e.g., phosphorous (P) or arsenic (As), is employed for the N-type implantation.

Figure 4G:
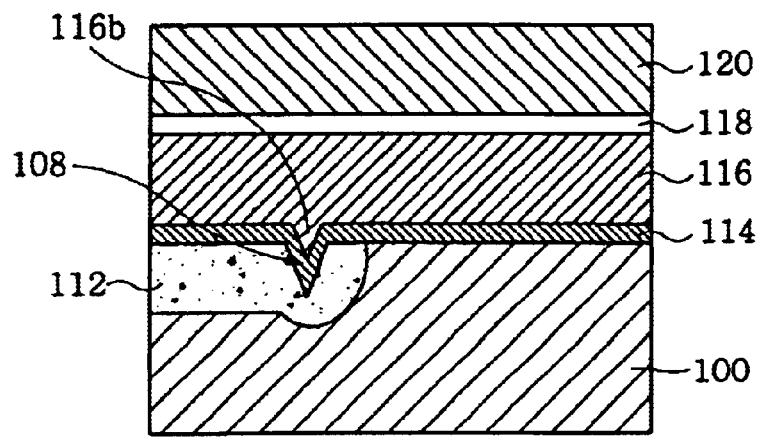

In FIG. 4G, after the first photoresist pattern 110 and the buffer layer 102 are removed, the gate insulating layer 114 serving as a tunnel oxide under the floating gate 116a in FIG. 3 is conformally formed by thermal oxidation to cover an upper surface of the semiconductor substrate 100. Then, a first conductive layer 116, another insulating layer 118, and a second conductive layer 120 are sequentially formed on the gate insulating layer 114. The first conductive layer 116 has the tip 116b filling the groove 108 of the semiconductor substrate 100.

Each of the first and the second conductive layer 116 and 120 may be a single or multilayers of doped polysilicon or metal. The insulating layer 118 may be a single or multilayers of silicon oxide, silicon nitride, or a high dielectric constant material, e.g., $Ta_2O_5$.

Figure 4H:
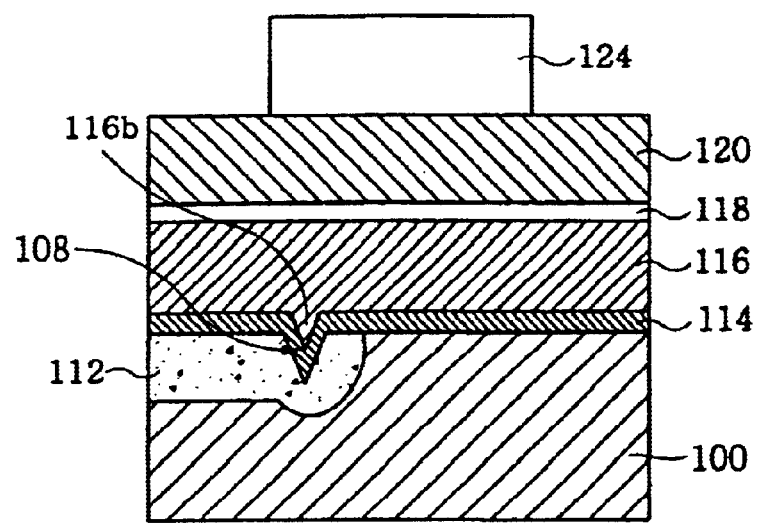
Figure 4I:
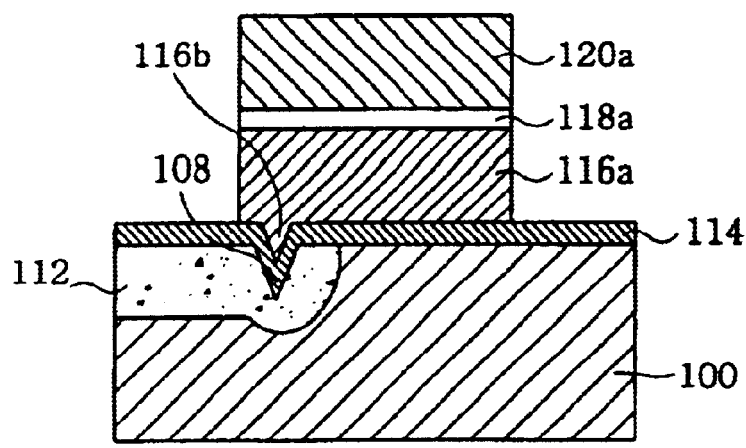

In FIG. 4H, a second photoresist pattern 124 is formed on the second conductive layer 120 to define a gate region of the cell transistor, wherein the second photoresist pattern 124 is positioned over the groove 108. Then, the first conductive layer 116, the insulating layer 118, and the second conductive layer 120 are patterned by using the photoresist pattern 124 used as a mask, so that the floating gate 116a, the inter-gate insulating layer 118a, and the control gate 120a are respectively formed, as shown in FIG. 4I. Because the second photoresist pattern 124 overlays the groove 108, the control gate 120a and the floating gate 116a, each being formed by using the second photoresist pattern 124, also overlay the end portion of the source region 112.

Figure 4J:
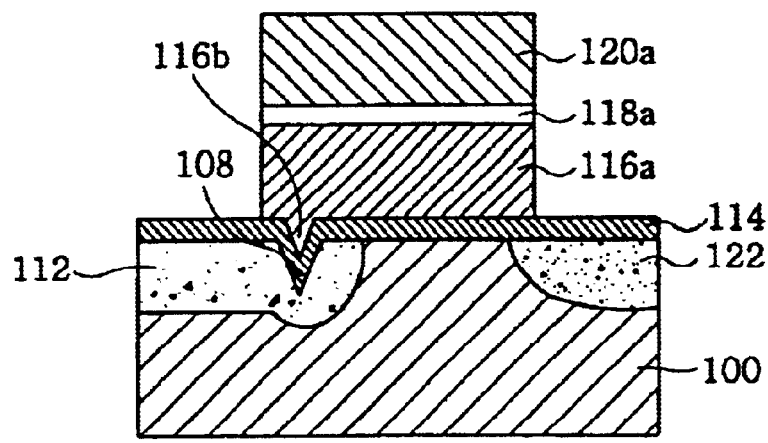

In FIG. 4J, after a third photoresist pattern (not shown) is formed to cover the source region 112, a drain dopant is implanted in the semiconductor substrate 100 through the gate insulating layer 114 so that the drain region 122 is formed therein. The high concentration N-type implantation may be also used to form the drain region 122, wherein the N-type dopant, e.g., phosphorous (P) or arsenic (As), is employed therefor. After the drain region 122 is formed, the third photoresist pattern is removed.

While the invention has been shown and described with respect to the preferred embodiment, it will be understood to those skilled in the art that various changes and modifications may be made without departing from the spirit and scope of the invention as defined in the following claims.

What is claimed is:

1. A method of fabricating a cell transistor, comprising the steps of:
   forming a groove recessed into a semiconductor substrate;
   forming a source region in said semiconductor substrate, wherein said source region overlaps with said groove, so that said source region covers said groove entirely;
   sequentially forming a gate electrode by laminating and patterning a gate insulating layer, a floating gate, an inter-gate layer, and a control gate on said semiconductor substrate; and
   forming a drain region in said semiconductor substrate.

2. The method of claim 1, wherein the step of forming the groove includes the steps of:
   sequentially forming a buffer layer and an etching mask layer on said semiconductor substrate;
   patterning said etching mask layer such that a portion of said buffer layer is exposed;
   forming a spacer on inner walls of said patterned etching mask;
   patterning said buffer layer by using said spacer as an etching mask; and
   forming said groove, recessed into the semiconductor substrate, by using said patterned buffer layer as an etching mask.

3. The method of claim 1, further comprising the step of:
   removing the buffer layer after the step of forming said source region.

4. The method of claim 2, wherein said buffer layer and said etching mask layer are respectively made of first and second insulation materials, wherein said first and said second insulation material have different etching selectivities.

5. The method of claim 1, wherein said groove is formed by a dry etching.

6. The method of claim 1, wherein said groove is formed by a wet etching.

7. The method of claim 1, wherein said groove is a V-shaped groove, a U-shaped groove, or a rectangular groove.

8. The method of claim 1, wherein said groove has a depth of about 0.1 $\mu$m to about 0.2 $\mu$m.

9. The method of claim 1, wherein said groove has a width of about 0.1 $\mu$m to about 0.2 $\mu$m.

10. The method of claim 1, wherein said floating gate overlaps with said source region at a width of about 0.4 $\mu$m to about 0.6 $\mu$m.

* * * * *